United States Patent
Cooley et al.

(10) Patent No.: US 7,447,957 B1
(45) Date of Patent: Nov. 4, 2008

(54) DYNAMIC SOFT-ERROR-RATE DISCRIMINATION VIA IN-SITU SELF-SENSING COUPLED WITH PARITY-SPACE DETECTION

(75) Inventors: John J. Cooley, Escondido, CA (US); Kenny C. Gross, San Diego, CA (US); Aleksey M. Urmanov, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 541 days.

(21) Appl. No.: 11/194,955

(22) Filed: Aug. 1, 2005

(51) Int. Cl.
*G11C 29/00* (2006.01)
(52) U.S. Cl. .................................. 714/723; 714/718
(58) Field of Classification Search ............... 714/723, 714/718
See application file for complete search history.

(56) References Cited

U.S. PATENT DOCUMENTS

| | | | |
|---|---|---|---|
| 4,506,362 A * | 3/1985 | Morley | 714/6 |
| 5,233,616 A * | 8/1993 | Callander | 714/758 |
| 5,291,499 A * | 3/1994 | Behrens et al. | 714/796 |
| 5,361,267 A * | 11/1994 | Godiwala et al. | 714/755 |
| 5,388,224 A * | 2/1995 | Maskas | 710/104 |
| 5,511,164 A * | 4/1996 | Brunmeier et al. | 714/53 |
| 6,304,257 B1 * | 10/2001 | Viskari | 715/764 |
| 6,560,725 B1 * | 5/2003 | Longwell et al. | 714/54 |
| 6,675,315 B1 * | 1/2004 | Semler et al. | 714/4 |
| 6,948,094 B2 * | 9/2005 | Schultz et al. | 714/15 |
| 2003/0074601 A1 * | 4/2003 | Schultz et al. | 714/15 |
| 2004/0216003 A1 * | 10/2004 | Floyd et al. | 714/25 |

* cited by examiner

*Primary Examiner*—Mujtaba K Chaudry
(74) *Attorney, Agent, or Firm*—Park, Vaughan & Fleming LLP

(57) ABSTRACT

A system that facilitates distinguishing between soft errors and the onset of hardware degradation in a computer system. During operation, the system receives notifications of correctable-error events from a plurality of memory components. The system then averages numbers of correctable-error events from the plurality of memory components to generate an average number of correctable-error events across the plurality of memory components. The system subtracts the number of correctable-error events for a given memory component in a given time interval from the average number of correctable-error events to generate a residual number of correctable-error events for the given memory component in the given time interval.

8 Claims, 2 Drawing Sheets

DYNAMIC SOFT-ERROR-RATE DISCRIMINATION VIA IN-SITU SELF-SENSING COUPLED WITH PARITY-SPACE DETECTION

BACKGROUND

1. Field of the Invention

The present invention relates to error-detection techniques in computer systems. More specifically, the present invention relates to a method and apparatus for using in-situ self-sensing in combination with parity-space detection to distinguish between soft errors and the onset of hardware degradation in computer systems.

2. Related Art

Cosmic neutrons are often responsible for causing transient errors, also called soft errors or correctable-errors (CEs), in integrated circuit (IC) logic and memory components. Two trends are causing the incidence of these soft errors to increase with each new generation of IC logic and memory components: (1) the density of memory cells continues to increase exponentially, thereby providing many more "targets" for each cosmic neutron; and (2) supply voltage is decreasing, thereby making these components more susceptible to cosmic neutron events. (Note that the cross-section for cosmic neutron events increases exponentially with the inverse of voltage.)

Changes in soft error rates (SERs) can signify the onset of hardware degradation. To improve the reliability, availability, and serviceability (RAS) of a computer system and to predict the onset of hardware degradation, the SER of a computer system can be monitored using a soft-error rate discrimination (SERD) technique to determine if the SER is increasing. However, a SERD technique that gives too many false alarms can create customer dissatisfaction and lead to excessive "No-Trouble-Found" (NTF) events. Therefore, a technique that facilitates accurately distinguishing between soft errors and the onset of hardware degradation is highly desirable.

One technique for distinguishing between soft errors and the onset of hardware degradation is to compare the cosmic neutron events reported by a neutron detector with CE events reported by a computer system. Unfortunately, a neutron detector is expensive, which makes it impractical to incorporate such a neutron detector into every computer system.

Another technique for distinguishing between soft errors and the onset of hardware degradation is to assign a threshold to CE events. A fixed-threshold SERD technique assumes that the cosmic neutron flux is a stationary process with time. Unfortunately, the cosmic neutron background is not stationary with time, but instead, has large dynamic variations (such as peaks and troughs) that are superimposed on top of long-term variations. The short term spikes as well as the long term variations result from variations in sun-spot activity and other cosmic events. These events can cause dynamic variations by as much as a factor of six in hourly cosmic neutron flux levels at sea level (and even larger variations at higher altitudes). In addition to short-term fluctuations that are attributable to the "burstiness" of cosmic events, there are also systematic long-term variations that occur over the course of weeks, and an additional 20% long-term variation that correlates with the 11-year sunspot cycle.

These inherent dynamic variations in soft error likelihood impose a fundamental limit on the sensitivity with which changes in SER can be detected. If there is no way to dynamically adjust the likelihood for soft error events, the threshold for SERD must be set above the levels attained by the highest daily peaks in cosmic flux. However, if a change in SER occurs during the "troughs" in cosmic activity, the SERD technique will be insensitive these changes.

A second challenge that affects both the conventional SERD and Sequential Probability Ratio Test (SPRT) techniques is dealing with acceleration of SER due to altitude. Due to less atmospheric attenuation of cosmic particles at high altitudes, there can be as much as a 70% acceleration in cosmic neutron flux between a datacenter at sea level and a datacenter at higher altitude. Similarly, if a constant-threshold "leaky bucket" technique is adjusted so as to not give excessive false alarms for datacenters at high altitudes, the technique does not catch the onset of hardware degradation for customers at sea level.

Yet another technique for distinguishing between soft errors and the onset of hardware degradation is to use an "N over T" (N/T) threshold, also called a "leaky bucket" technique. If there are N events within some time interval T, then the memory is declared faulty and is replaced. Typical values of N/T range from 3 CE events in 24 hours to 24 CE events in 24 hours.

Unfortunately, cosmic events are not stationary with time. More specifically, there can be significant peaks and troughs in cosmic activity. Furthermore, these variations can increase memory NTF events, which are costly in terms of the hardware exchanged, serviceability costs, and customer dissatisfaction. Note that when memory is replaced due to normal cosmic neutron events, the new memory is just as likely to exhibit CE's as the replaced memory.

Hence, what is needed is a method and an apparatus for distinguishing between soft errors and the onset of hardware degradation without the problems described above.

SUMMARY

One embodiment of the present invention provides a system that facilitates distinguishing between soft errors and the onset of hardware degradation in a computer system. During operation, the system receives notifications of correctable-error events from a plurality of memory components. The system then averages numbers of correctable-error events from the plurality of memory components to generate an average number of correctable-error events across the plurality of memory components. The system subtracts the number of correctable-error events for a given memory component in a given time interval from the average number of correctable-error events to generate a residual number of correctable-error events for the given memory component in the given time interval.

In a variation on this embodiment, the system determines if the residual number of correctable-error events for a given memory component in a given time interval exceeds a threshold. If so, the system generates a warning message.

In a variation on this embodiment, the system determines if a time-series of residuals for a given memory component is a stationary white-noise time-series with a zero mean. If so, the system determines that the time-series does not indicate the onset of hardware degradation for the given memory component.

In a variation on this embodiment, the system determines if the time-series of the residuals for a given memory component is non-zero. If so, the system determines that the time-series indicates the onset of hardware degradation for the given memory component.

In a variation on this embodiment, the system uses a sequential probability ratio test to evaluate the residuals for the given memory component to generate quantitative and configurable false-alarm and missed-alarm probabilities for the given memory component.

In a variation on this embodiment, the memory components can include banks of memory or cache memories.

In a variation on this embodiment, the plurality of memory components are located within one computer system.

In a variation on this embodiment, the plurality of memory components are distributed across a plurality of computer systems.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Computer System

The present invention provides a dynamic SERD technique that uses in-situ self-sensing of memory components in the datacenter coupled with a "parity-space" technique to compensate for dynamic variations in cosmic neutron activity. The SERD technique can be used to discriminate between soft errors that arise from cosmic neutron events and the onset hardware degradation. Note that the present invention uses CE events from multiple memory components within a computer system and/or multiple memory components in a plurality of computer systems located throughout a datacenter to determine if a given memory component is at the onset of hardware degradation or if the CE event reported by a given memory component was a soft error, such as a cosmic neutron event.

Figure 1:
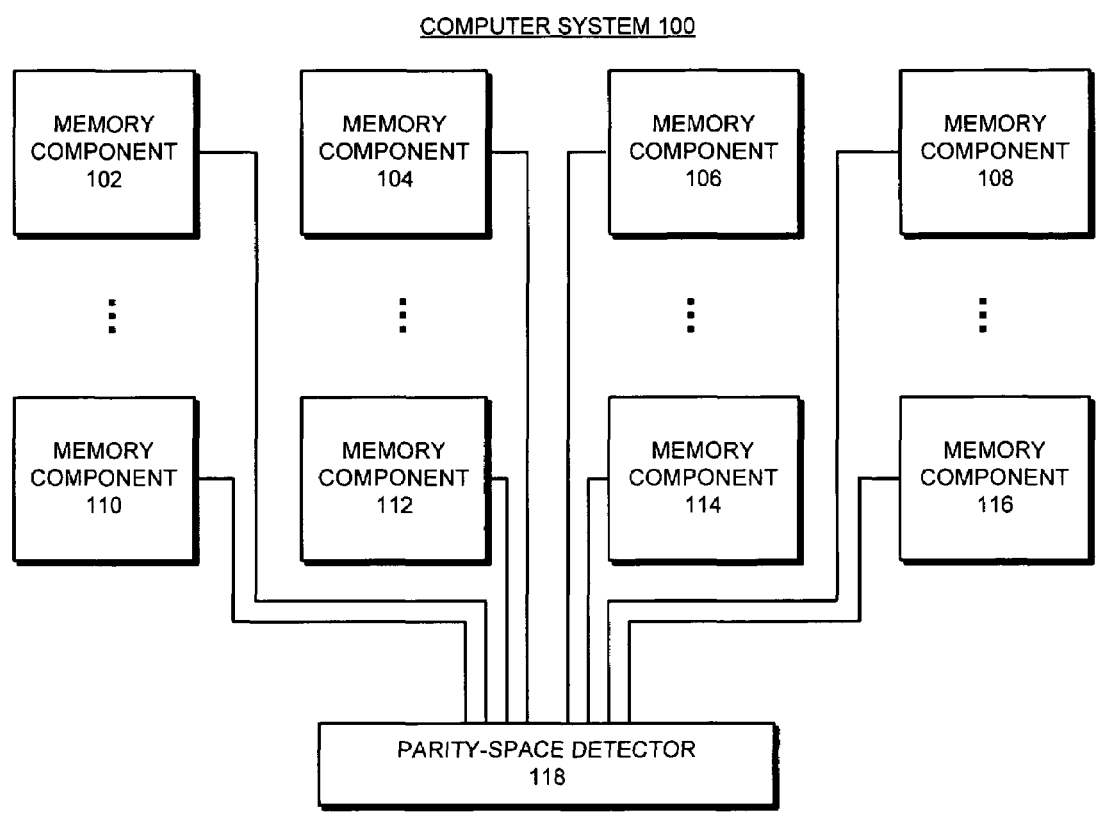
FIG. 1 presents a block diagram of a computer system containing a plurality of memory components in accordance with an embodiment of the present invention.

FIG. 1 presents a block diagram of a single computer system 100 containing a plurality of memory components 102, 104, 106, 108, 110, 112, 114, and 116 in accordance with an embodiment of the present invention. These memory components send CE event notifications to parity-space detector 118. Note that the memory components can include banks of memory, cache memories, or any other type of memory component. Parity-space detector 118 then determines if the CE events arise from soft errors or the onset of hardware degradation.

Note that the memory banks can alternatively be in different computer system in a datacenter.

Parity-Space Detection

The parity-space technique is commonly used for Failure Detection and Isolation (FDI) of dynamical systems. FDI is a two-stage process which includes: (1) residual generation and (2) decision making. Parity relationships provide a systematic way of generating residual vectors. Note that there is one residual vector for each system under surveillance. When all systems are behaving as they should, each residual vector is a stationary white-noise time series with a zero mean. If one of the components develops hardware degradation, then the residual vector associated with that component starts to show a non-zero mean.

The benefit of the parity-space technique is that it makes the system immune to dynamic variations that affect all of the components concurrently. The present invention, uses the observed CE events in memory components for in-situ self-sensing of cosmic neutron events, then integrates the observed CE events using the parity-space technique. In doing so, any dynamic variations in cosmic neutron events will be "filtered out" by the parity-space technique in such a way that the residual vectors will be stationary with time. If there is a non-zero trend growing in any given residual vector, the memory component associated with that residual vector is likely to be at the onset of hardware degradation.

The mean value of the CEs as a function of time follows the dynamics of the cosmic neutron flux. Using a parity-space technique, counts from individual memory components are subtracted from the mean value of CEs to generate residual vectors. Note that after normalizing for dynamic flux, the remaining residuals form a stationary Poisson process with nominal mean of zero. A departure from zero for the residual vectors provides an indication of the onset of hardware degradation. The residual vectors are then evaluated with a Poisson Sequential Probability Ratio Test (SPRT) to compute quantitative and configurable false-alarm and missed-alarm probabilities.

In-Situ Self-Detection of Soft-Error-Rate (SER): Consider the following SER model:

$$n(t), t=0, T, 2T, \ldots,$$

is a time series of fast neutron count in a datacenter. Note that T is a fixed time interval.

$$y_i(t)=c_i n(t), i=1, \ldots, M,$$

is the number of CE events measured by the $i^{th}$ sensor (CE event count for a DIMM, a system board, or a server in the datacenter). The coefficients $c_i$ include the chance that a neutron will cause a bit-flip in memory and the current load profile of the server.

Parity Relationships: Let w be a row vector of dimension M. Consider a non-zero w satisfying:

$$w[c_1, \ldots, c_M]^T n(t)=0, n(t) \text{ in } R^1$$

Let W be an M by M matrix with a set of linearly independent w's as its rows, then $$P(t)=W[y_i(t), \ldots, y_M(t)]^T$$

is called the parity vector. The M dimensional space of all such vectors in the parity-space. In the absence of failures, P(t) is a zero-mean random vector. Under failures, P(t) will become biased.

Generating Residuals: For a zeroth-order parity relation, which is a direct analytical redundancy relation, the residuals are:

$$r_i(t) = w_{i1}y_1(t) + \ldots + w_{iM}y_M(t), I=1, \ldots, M.$$

A non-zero $r_i$ indicates an abnormal value for the CE event counter $y_i$. These residuals carry the signatures of abnormal CE event counts corresponding to the onset of hardware degradation of the memory components, and will be totally immune to dynamic variations in cosmic neutron intensity.

An additional benefit from the self-sensing technique coupled with a parity-space technique is that the residual vectors retain their nominal zero-mean property whether the datacenter is at sea level or at high altitudes. Therefore, the residuals retain optimal sensitivity for catching subtle onset of hardware degradation. By contrast, conventional fixed-threshold SERD techniques need to be tuned with loose enough sensitivity so that NTF events are not obtained at high altitude datacenters, where cosmic rates can be a factor of 13 higher than at sea level. Tuning the SERD technique with loose sensitivity diminishes sensitivity for subtle fault mechanisms at lower altitudes.

Example Residuals: For the SER model, the following set of w's:

$$w_1 = [M-1, -c_1/c_2, \ldots, -c_1/c_M]$$

$$w_2 = [-c_2/c_1, M-1, -c_2/c_3, \ldots, -c_2/c_M]$$

$$\ldots$$

$$w_M = [-c_M/c_1, \ldots, -c_M/C_{M-1}, M-1]$$

results in the following residuals for FDI of memory components, system boards, or servers:

$$r_i(t) = (c_i/c_1 y_1(t) + \ldots + c_i/c_{i-1}(t) + c_i/c_i + y_{i+1}(t) + \ldots + c_i/c_M y_M(t))/(M-1), i=1, \ldots, M$$

Figure 2:
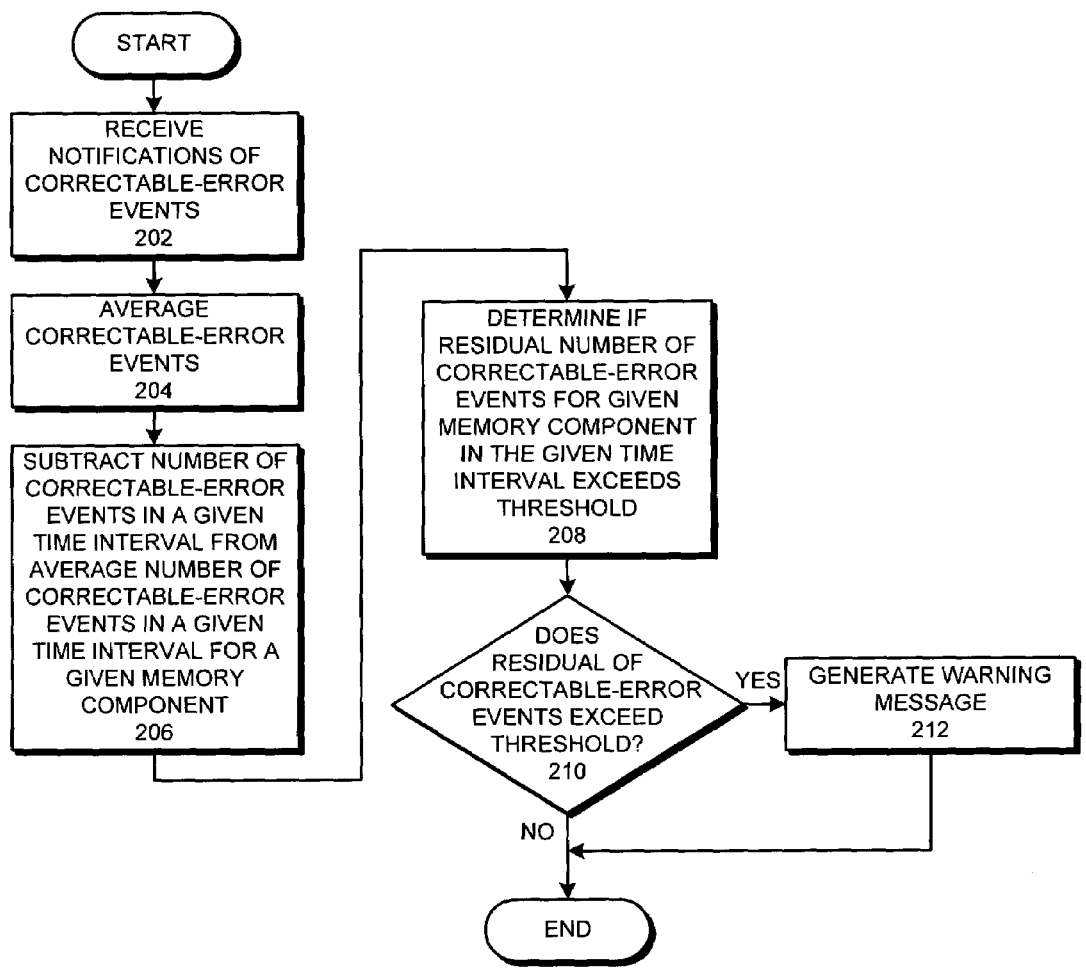
FIG. 2 presents a flow chart illustrating the process of distinguishing between soft errors and the onset of hardware degradation in a computer system in accordance with an embodiment of the present invention.

FIG. 2 presents a flow chart illustrating the process of distinguishing between soft errors and the onset of hardware degradation in a computer system in accordance with an embodiment of the present invention. The process begins when the system receives notifications of correctable error events from a plurality of memory components (step 202). The system then averages the number of measured correctable error events from each of the plurality of memory components to generate an average number of CE events across the plurality of memory components (step 204). For each set of CE events received from a given memory component in a given time interval, the system subtracts the set of CE events in the given time interval from the average number of CE events in the given time interval to generate a residual number of CE events for the given memory component in the given time interval (step 206). The system then determines if the residual number of CE events for a given memory component in the given time interval exceeds a threshold (steps 208 and 210). If so, the system generates a warning message (step 212).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for distinguishing between soft errors and the onset of hardware degradation in a computer system, comprising:
   receiving notifications of correctable-error events from a plurality of memory components;
   averaging numbers of correctable-error events from the plurality of memory components to generate an average number of correctable-error events across the plurality of memory components; and
   for a given memory component, subtracting the number of correctable-error events for the given memory component in a given time interval from the average number of correctable-error events to generate a residual number of correctable-error events for the given memory component in the given time interval.

2. The method of claim 1, wherein the method further comprises:
   determining if the residual number of correctable-error events for a given memory component in a given time interval exceeds a threshold; and
   if so, generating a warning message.

3. The method of claim 1, wherein the method further comprises:
   determining if a time-series of residuals for a given memory component is a stationary white-noise time-series with a zero mean; and
   if so, determining that the time-series does not indicate the onset of hardware degradation for the given memory component.

4. The method of claim 3, wherein the method further comprises:
   determining if the time-series of the residuals for a given memory component is non-zero; and
   if so, determining that the time-series indicates the onset of hardware degradation for the given memory component.

5. The method of claim 1, wherein the method further comprises using a sequential probability ratio test to evaluate the residuals for the given memory component to generate quantitative and configurable false-alarm and missed-alarm probabilities for the given memory component.

6. The method of claim 1, wherein the memory components can include banks of memory or cache memories.

7. The method of claim 1, wherein the plurality of memory components are located within one computer system.

8. The method of claim 1, wherein the plurality of memory components are distributed across a plurality of computer systems.

* * * * *